United States Patent [19]
Massie

[11] Patent Number: 5,534,771
[45] Date of Patent: Jul. 9, 1996

[54] HIGH PRECISION DC-DC CONVERTER

[75] Inventor: Harold L. Massie, Linn, Oreg.

[73] Assignee: Intel Corporation, Santa Clara, Calif.

[21] Appl. No.: 184,387

[22] Filed: Jan. 21, 1994

[51] Int. Cl.$^6$ .................................................. G05F 1/44
[52] U.S. Cl. ......................................... 323/285; 323/284
[58] Field of Search ..................................... 323/282, 283, 323/284, 285, 286, 351

[56] References Cited

U.S. PATENT DOCUMENTS

| | | | |
|---|---|---|---|
| 4,736,267 | 4/1988 | Karlmann et al. | 323/285 X |
| 4,945,465 | 7/1990 | Marinus et al. | 363/89 |
| 5,166,871 | 11/1992 | Carroll et al. | 323/284 X |
| 5,229,023 | 6/1992 | Sabroff | 323/267 |
| 5,448,155 | 9/1995 | Jutras | 323/285 |
| 5,461,301 | 10/1995 | Truong | 323/207 |

Primary Examiner—Peter S. Wong
Assistant Examiner—Y. Jessica Han
Attorney, Agent, or Firm—Blakely, Sokoloff, Taylor & Zafman

[57] ABSTRACT

A high precision DC-DC converter circuit having improved efficiency is disclosed. The DC-DC converter circuit includes a low accuracy switching regulator circuit for driving a switching field effect transistor (FET) on and off. A high accuracy output voltage regulator circuit is inserted into the feedback loop between the output of the DC-DC converter circuit and the sensing input of the switching regulator circuit such that the accuracy of the output voltage regulator circuit primarily determines the precision of the DC-DC converter. The DC-DC converter also includes a quick shut-off circuit coupled to the gate and source of the FET for driving the gate of the FET negative when the FET is switched off such that switching losses are minimized. A second embodiment of the high precision DC-DC converter is used to convert from 5.0 to 3.3 volts. The second embodiment includes a transformer, one winding of which is used as an output inductor. The second winding is used as part of a multiplying bootstrap circuit that approximately triples the 5.0 volt input voltage to drive the gate of an n-channel switching FET. The second embodiment also includes a circuit for extending the duty cycle of the switching regulator in response to a load transient on the output.

35 Claims, 5 Drawing Sheets

HIGH PRECISION DC-DC CONVERTER

BACKGROUND OF THE INVENTION

1. Field of the Invention

The invention of the present disclosure relates to switching voltage regulators and more particularly to DC-DC converters in a computer system.

2. Art Background

The power supplies in a computer system are designed to meet the specific power requirements of the integrated circuit chips (ICs) that are the components of the system. The nominal operating voltages for the ICs are typically known because most ICs are manufactured to meet industry standards for device operation. For example, the nominal supply voltage for transistor-transistor logic (TTL) devices is 5.0 volts while the nominal supply voltage for complementary metal oxide semiconductor (CMOS) devices is 3.3 volts.

A power supply will ideally deliver the nominal voltage levels with perfect assurance and precision, but power supplies are typically inaccurate due to a number of factors. A typical range of assurance for a power supply is plus or minus five percent. Accordingly, most ICs are designed to operate within a range of plus or minus five percent of the nominal voltage. However, some ICs are less tolerant of power supply inaccuracies, and some ICs may require a nominal operating voltage other than the standard TTL and CMOS voltages. The operating voltage of an IC having either one or both of these characteristics can be supplied by a DC-DC converter that converts the DC output of the power supply into the desired DC operating voltage.

DC-DC converters are typically switching voltage regulators, which are more efficient than linear regulators. The need for efficiency is emphasized when the DC-DC converter is to be used to supply voltage to a single IC, which could be the processor of the computer system. If too much power is dissipated while the DC-DC converter is operating, heat sinks will be needed and the footprint of the DC-DC converter will be increased. This is especially undesirable when the amount of available board space is limited. Thus, maximum efficiency is one goal of DC-DC converter design. Unfortunately, typical prior art designs fail to maximize efficiency because switching losses associated with switching the power switching transistor on and off are often not addressed. These switching losses are often magnified in DC-DC converter designs for converting TTL to CMOS voltages because such designs typically implement a p-channel switching transistor, which is often more lossy than n-channel switching transistors.

Another problem in DC-DC converter design are load transients. Some ICs, such as processors, are capable of entering a sleep mode wherein the IC draws little or no current. When the IC exits the sleep mode, the load that the IC presents to the DC-DC converter increases dramatically, and the IC goes from drawing little or no current to drawing its normal current. Such transients must be addressed.

A further consideration in DC-DC converter design is cost. The precision of a switching voltage regulator is primarily dependent on the accuracy of the reference voltage used by the switching regulator. High precision switching regulator ICs are commercially available, but implementing them in a DC-DC converter design can be cost-prohibitive, especially when the DC-DC converter is to be used to supply only a single IC. Therefore, a low cost, high precision DC-DC converter design that implements a low precision switching regulator is desired. As will be described, the method and apparatus of the present invention provide a high-precision DC-DC converter having improved efficiency at a low cost.

SUMMARY OF THE INVENTION

A method and apparatus for converting a DC input voltage VDD to a high precision DC output voltage VCC is described. A first embodiment of the present invention is a DC-DC converter circuit including a switching transistor, which is preferably a field effect transistor (FET) that has its drain coupled to VDD. A switching regulator circuit that preferably includes a switching regulator is coupled to the gate of the switching transistor. The switching regulator circuit drives the switching FET on and off such that VDD is coupled to the source of the FET when the FET is on. The duty cycle of the switching regulator circuit determines the output voltage level and is varied by comparing a sensed voltage level to a first setpoint reference voltage level having a second accuracy level. An output circuit is coupled to the source of the switching FET and filters the output pulses on the source of the switching FET such that a DC output voltage level is produced. An output voltage regulator circuit is coupled to the DC output level and to the switching regulator circuit. The output regulator circuit produces the sensed voltage level by comparing the output voltage level to a second setpoint reference voltage level having a third accuracy level that is greater than both the second accuracy level and the first accuracy level. In this manner, the switching regulator circuit drives the switching transistor such that the first voltage level is equal to VCC within the first accuracy level. The first embodiment of the invention further includes a quick shut-off circuit that drives a negative voltage on the gate of the switching FET such that switching losses are reduced. In this manner, the efficiency of the DC-DC converter is increased.

A second embodiment of the present invention is capable of being used when the desired output voltage VCC is a substantial percentage of the input voltage VDD, e.g. where VDD is 5.0 volts and VCC is 3.3 volts, or when the input voltage VDD is relatively low, e.g. 5.0 volts. The second embodiment includes the switching regulator and output regulator circuits for increased precision, and the quick shut-off circuit for increased efficiency. In addition, the second embodiment of the present invention further includes a transformer at its output, the secondary winding of the transformer being used to provide additional drive to the switching FET. The second embodiment also includes a duty cycle extender circuit for extending the duty cycle of the switching regulator circuit when a load coupled to the output of the DC-DC converter suddenly increases, as when a processor goes from a sleep mode to normal operation. The use of the transformer and the duty cycle extender circuit yields increased transient response and maximum power output.

DC-DC converter circuits according to the present inventions can be incorporated into computer systems for supplying non-standard nominal voltages at a high precision level to a processor that interfaces with components operating at standard nominal voltages. The processor may be, for example, the Pentium™ microprocessor manufactured by Intel Corporation of Santa Clara, Calif.

BRIEF DESCRIPTION OF THE DRAWINGS

The objects, features, and advantages of the method and apparatus of the present invention will be apparent from the following detailed description of the invention in which.

DETAILED DESCRIPTION

Illustrative embodiments of the present invention relate to high precision DC-DC converters that operate with improved efficiency. An output voltage regulator circuit having a high accuracy reference voltage samples the output voltage of the DC-DC converter and provides a voltage that is sensed by a switching regulator circuit. The switching regulator circuit compares the sensed voltage to a second reference voltage and alters its duty cycle accordingly. Any inaccuracies introduced by the switching regulator circuit are corrected by the output voltage regulator circuit. Efficiency is improved through the use of a quick shut off circuit that minimizes switching losses by driving the power switching transistor of the DC-DC converter off quickly.

According to a first illustrative embodiment of a present invention, a DC-DC converter generates a non-standard nominal voltage level at a high level of precision. The DC-DC converter of the first illustrative embodiment further includes circuitry that limits the voltage swing when supplying the non-standard nominal voltage level to a processor or other IC that interfaces with ICs that operate according to standard nominal voltage levels.

The DC-DC converter of the second illustrative embodiment may be used to convert a TTL input supply signal to a CMOS output operating level. Circuitry of the DC-DC converter of the second illustrative embodiment enables the extension of the maximum duty cycle of the switching regulator in order to provide operating voltage to a processor when the processor goes from a sleep mode to an operating mode. One having ordinary skill in the art will recognize that the applications of the various embodiments are not limited to the illustrative list provided above.

Figure 1:
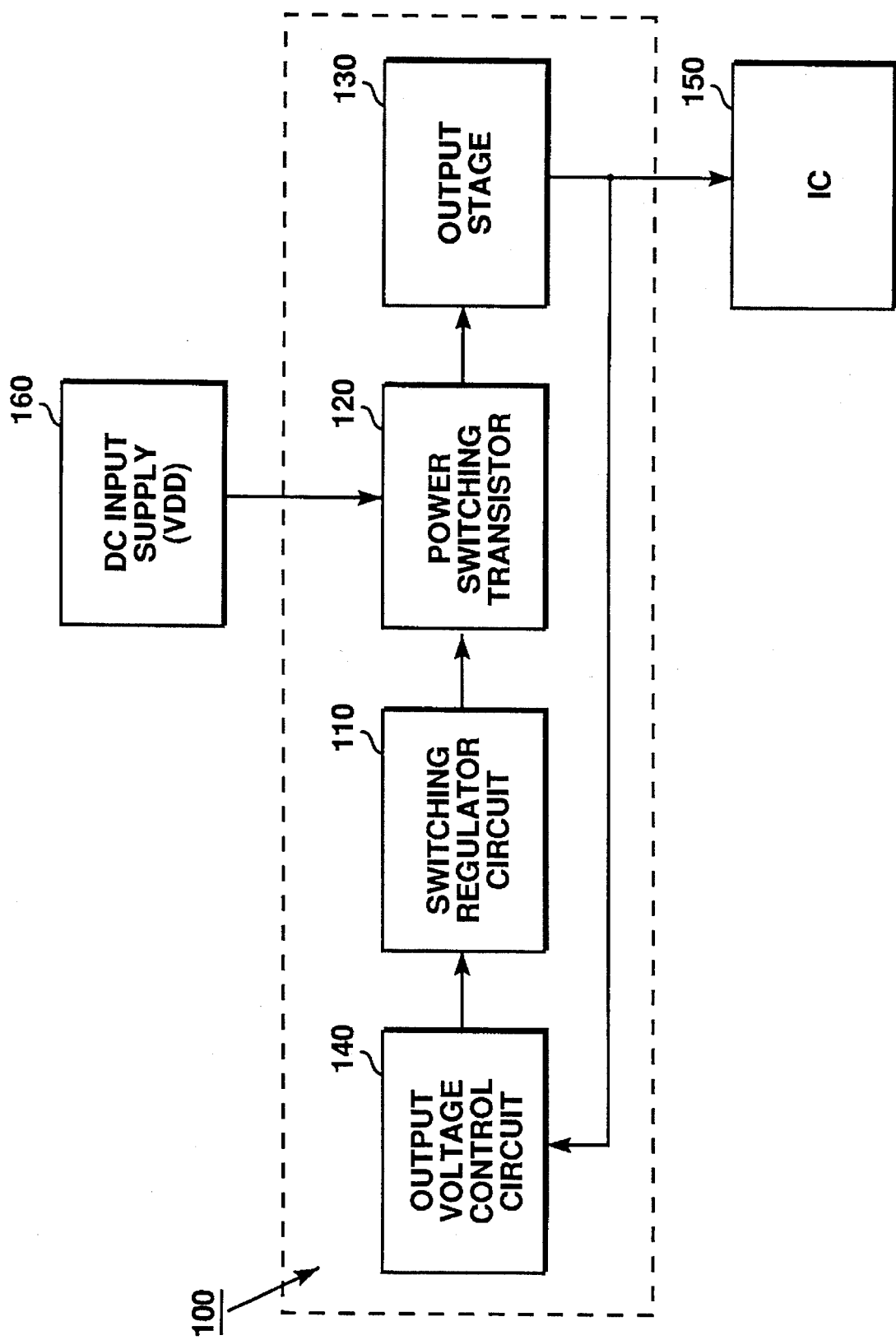
FIG. 1 is a block diagram illustrating the general aspects of one embodiment of the present invention.

FIG. 1 illustrates, in block diagram form, a generalized DC-DC converter according to the method and apparatus of the present disclosure. In this generalized representation, the DC-DC converter 100 generates an output voltage VCC at the output stage 130 by continuously switching the power switching transistor 120 on and off. As is well known in the prior art, the output voltage VCC is a function of the duty cycle of the switching regulator circuit 110 and input voltage VDD supplied by input supply 160. For example, if the switching regulator circuit 110 causes the power switching transistor 120 to be on sixty percent of the time, the output voltage VCC that is supplied to the IC 150 by the output stage 130 is equal to sixty percent of VDD.

The power switching transistor 120 may be any known power switching transistor, but is preferably an n-channel field effect transistor (FET). The switching regulator circuit 110 preferably includes a switching regulator IC that drives the power switching transistor 120 according to a sensed voltage that is compared to an internal setpoint reference voltage. The accuracy of the internal setpoint reference voltage of the switching regulator IC is not critical in this circuit because, unlike typical prior art DC-DC converters, the sensed voltage is not the output voltage of the output stage 130. Rather, an output voltage control circuit 140 is inserted in the feedback loop between the output stage 130 and the switching regulator circuit 110.

The output voltage control circuit 140 preferably includes a voltage reference IC having a very high precision internal setpoint reference voltage. The voltage reference IC compares the output voltage VCC to its internal setpoint reference voltage and supplies a reference output voltage that is sensed by the switching regulator IC. Any imprecision introduced by the inaccuracy of switching regulator IC's setpoint reference voltage will be eliminated by the output voltage control circuit 140. In this manner, the accuracy of the DC-DC converter is determined primarily by the accuracy of the voltage reference chip of the output voltage control circuit 140. The switching regulator IC and the voltage reference IC can be any of a number of low-cost commercially available ICs, allowing the DC-DC converter of the present invention to be implemented in existing systems cost-effectively. For example, the switching regulator IC is preferably a KA34063A switching regulator control circuit (or equivalent); and the voltage reference IC is preferably a TL431 voltage reference circuit (or equivalent). One having ordinary skill in the art will recognize that any high precision voltage reference circuit having the desired level of precision can be used with any low accuracy switching regulator circuit to produce a high precision DC-DC converter according to the present inventions.

In order to maximize the efficiency of the DC-DC converter, the switching regulator control circuit preferably includes a quick shut-off circuit that drives the gate of the power switching transistor 120 negative when the switching transistor is switched off. In this manner, switching losses due to the power switching transistor conducting current at the initiation of the off state are minimized. Other features and aspects of the DC-DC converters of the present disclosure will be discussed in relation to the specific embodiments. The discussion of the illustrative embodiments includes certain specific details that are not necessary to practice the inventions of the present disclosure. Accordingly, one having ordinary skill in the art will recognize that such details are to be considered as illustrative, not exhaustive.

Figure 2:
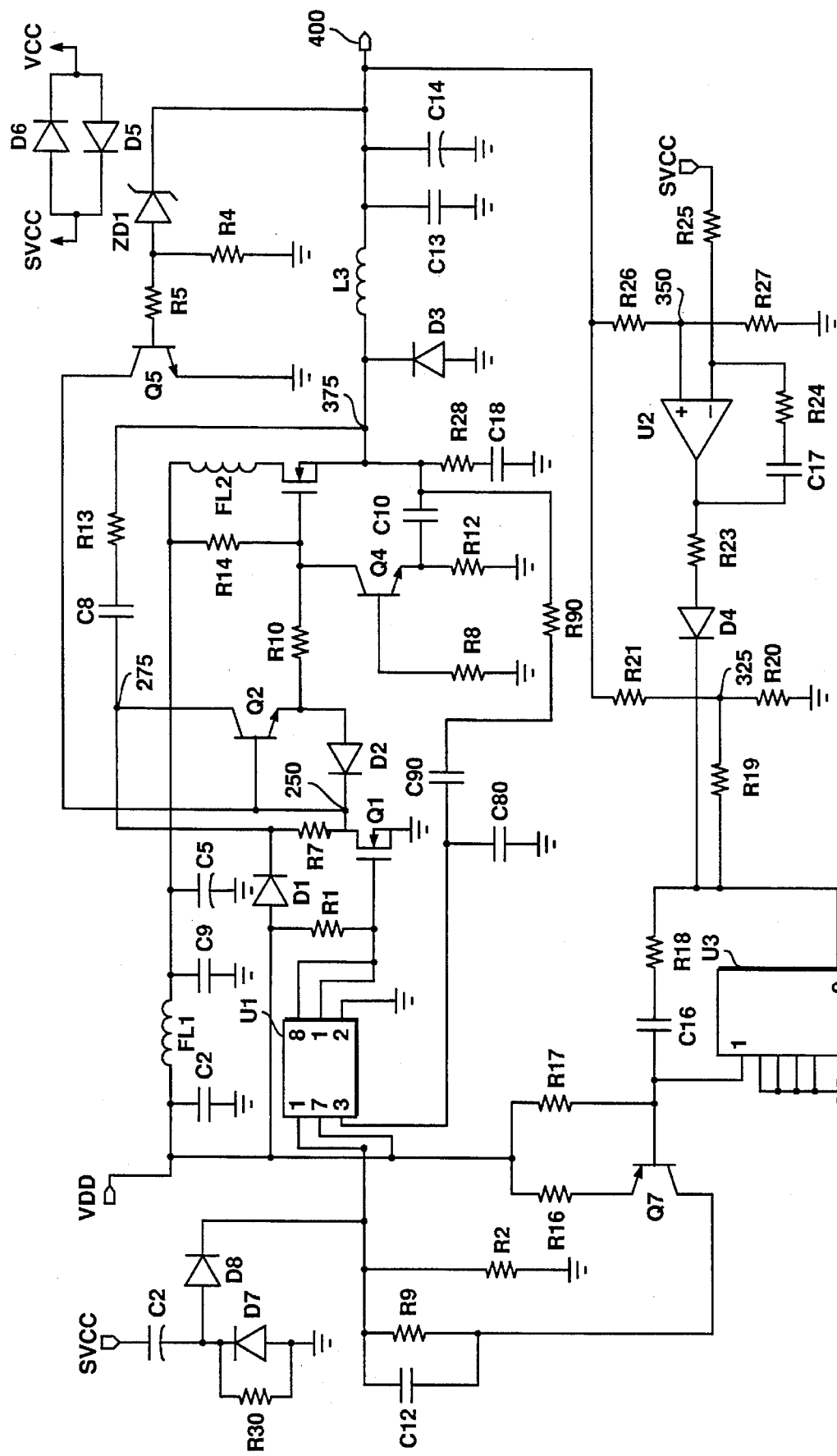
FIG. 2 illustrates a DC-DC converter circuit according to a first illustrative embodiment of the present invention

A first illustrative embodiment is shown in FIG. 2. In this embodiment, the output voltage VCC is preferably equal to 5.275 volts at plus or minus 1.5 percent and the input voltage VDD is preferably equal to 12.0 volts. As will be described, both the input voltage VDD and the output voltage level VCC can be varied without affecting the accuracy or efficiency of the DC-DC converter of the first illustrative embodiment. For example, the DC-DC converter shown in FIG. 2 can be altered such that VCC is equal to 3.3 volts.

Figure 3:
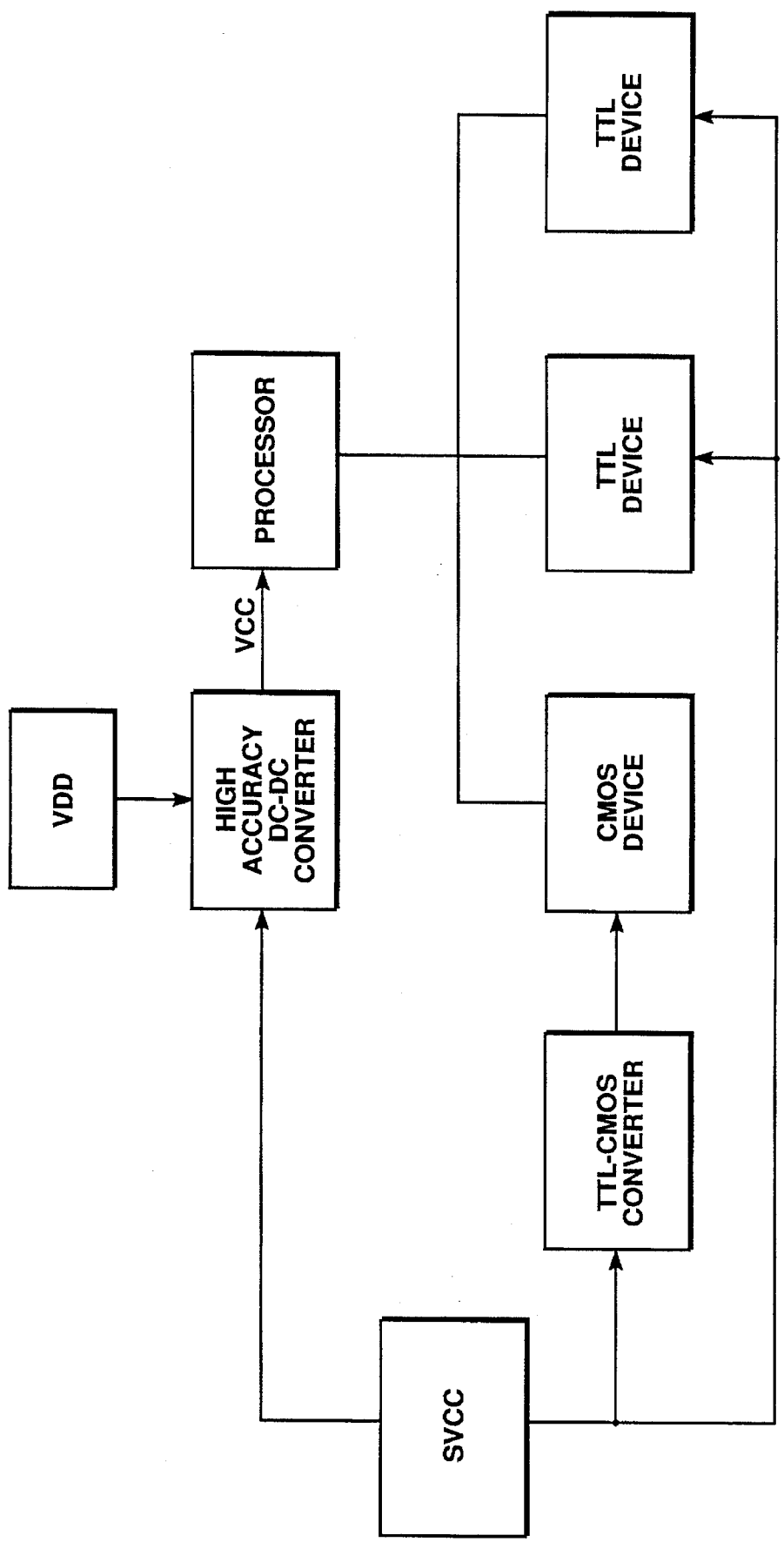
FIG. 3 is a block diagram illustrating a computer system that implements the DC-DC converter of the first illustrative embodiment of the present invention.

An exemplary system implementing the present invention is illustrated in FIG. 3 and includes a processor requiring a nominal voltage of 5.275 volts at plus or minus 2.0 percent. Such a processor may be, for example, the Pentium™ microprocessor manufactured by Intel Corporation of Santa Clara, Calif. The processor typically interfaces with ICs operating at nominal TEL and CMOS voltage levels. Alternatively or additionally, any integrated circuit requiring a high precision operating voltage can be coupled to receive the VCC output of the DC-DC converter of the present invention.

Returning to FIG. 2, the power switching FET Q3 is preferably an enhancement mode FET. When the FET Q3 is switched on, the gate-to-source voltage VGS is preferably sufficiently greater than the threshold voltage $V_T$ such that the FET Q3 is operating in the saturation region. This minimizes the drain-to-source resistance, resulting in minimized power dissipation when the power switching FET Q3 is switched on. VDD is coupled to the drain of Q3 via a filter network that prevents high frequency noise generated by switching FET Q3 on and off from affecting the VDD signal. The filter network of the first illustrative embodiment includes capacitor C2, inductor FL1, capacitor C9, capacitor C5 and inductor FL2. Inductor FL1 filters any current spikes, while inductor FL2 prevents oscillations. Thus, VDD is coupled to the drain of power switching FET Q3 via the inductor FL2. When the power switching FET Q3 is switched on, the source of Q3 is pulled up to approximately VDD. The precise values of the components of the filter network may be selected using prior art techniques.

In order to ensure an adequate drive voltage on the gate of power switching FET Q3, a bootstrap circuit is used. The bootstrap circuit of the first illustrative embodiment is well-known in the prior art, and provides a biasing voltage on the gate of power switching FET Q3 that is equal to approximately twice VDD. This bootstrap circuit is part of the switching regulator circuit and includes transistors Q1 and Q2, diodes D1 and D2, resistors R7, R10, R13 and R14, and capacitor C8. In order to turn the power switching FET Q3 on, switching regulator IC U1 drives its pin 1 low, which causes FET Q1 to turn off. This causes node 250 to be pulled up to approximately VDD via resistor R7 and diode D1. Node 250 is the node including the drain of FET Q1, the base of transistor Q2, the cathode of diode D2, and the resistor R7. The voltage at node 250 is approximately equal to 11.4 volts when VDD is equal to 12.0 volts.

As node 250 rises towards VDD, Q2 is switched on and the voltage level on the gate of power switching FET Q3 becomes large enough to switch the power switching FET Q3 on. The voltage at the source of power switching FET Q3 is fed back to capacitor C8 via resistor R13, which is coupled to the source of FET Q3 at node 375. This results in the voltage at the node 275 being approximately twice VDD. Node 275 is the node including the capacitor C8, the cathode of diode D1, the resistor R7, and the collector of transistor Q2. The voltage at node 275 is approximately 23 volts when VDD is equal to 12.0 volts. The voltage at node 275 is delivered to the gate of power switching FET Q3 via resistor R10 and the emitter of the driving transistor Q2. The emitter of driving transistor Q2 drives a voltage of approximately twice VDD on the gate of FET Q3 that is sufficient to cause saturation of the FET Q3 in the first illustrative embodiment. Thus, transistor Q2 provides high gate drive current while Q3 is turned on.

When power switching FET Q3 is turned off, the voltage on pin 1 of switching regulator IC U1 is high, and FET Q1 is switched on, pulling node 250 down to ground. This pulls the gate of FET Q3 down to ground. Diode D2 provides high gate sink current via node 250 when the power switching FET is turned off.

The function of the switching regulator IC U1 is to continually turn the power switching FET Q3 on and off via the bootstrap circuit described above. The frequency of the pulse stream is determined by the operating characteristics of the chosen switching regulator. One consequence of using an inexpensive switching regulator IC is that the IC may actually skip cycles because the oscillator of the IC can be unstable. To address this problem, the DC-DC converter uses an oscillator stabilizer circuit, coupled between node 375 and the switching regulator IC U1, that includes capacitor C90 and resistor R90. C90 and R90 reduce ripple and reduce the size of the output capacitors C13 and C14. Capacitor C13 filters high frequency noise, and capacitor C14 acts as a main filter for filtering out the ripple at the switching frequency of the switching transistor. C80 is the capacitor used to set the frequency of the switching regulator IC U1.

The output voltage VCC of the DC-DC converter is delivered to the output node 400 via an output stage that includes diode D3, inductor L3, and capacitors C13 and C14. When the power switching FET Q3 is turned on, the voltage on the drain of Q3 is conducted to the source of Q3, which is coupled to diode D3 and inductor L3 at node 375. When the power switching transistor Q3 is on, diode D3 is back-biased and current flows through the inductor L3, which stores energy. When Q3 is switched off, the inductor L3 releases the stored energy, causing the diode D3 to go into conduction, and current continues to flow through the inductor L3. The inductor L3 and the capacitor C13 filter the VDD pulses of the power switching transistor into an average DC output voltage VCC.

Figure 4:
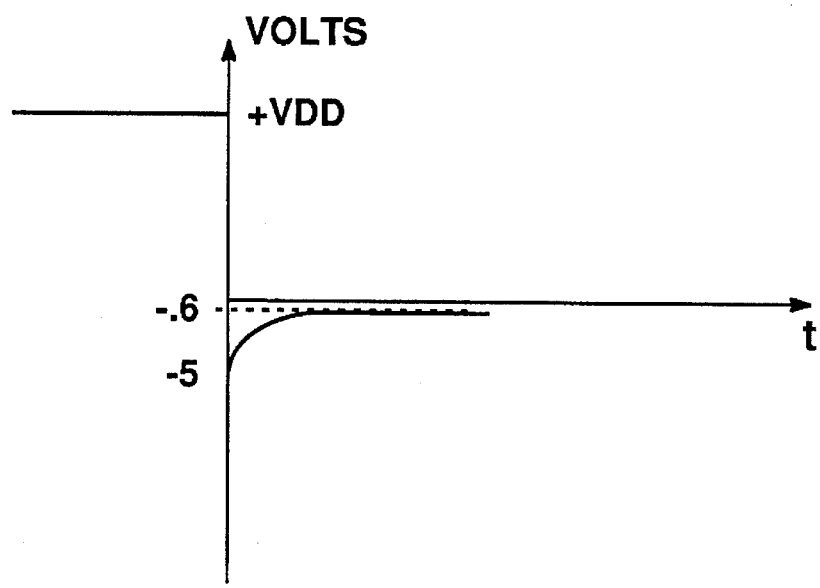
FIG. 4 illustrates the behavior of a catch diode when the power switching transistor is switched off.

The purpose of the diode D3 is to prevent a voltage level that is greater than one diode drop below ground from being presented at the source of FET Q3. Unfortunately, diode D3 is unable to go into conduction instantaneously, and a significant negative voltage is produced at node 375 when the FET Q3 is initially turned off. This behavior is illustrated in FIG. 4. In the prior art, because the source of the FET Q3 is at a negative voltage and the gate is only at ground, $V_{GS}$ can be large enough to cause the FET Q3 to remain on and operating outside of the saturation region. This increases the drain-to-source resistance and results in power dissipation while the FET Q3 is supposedly not conducting any current. This power loss occurs each time the FET Q3 is ostensibly switched off, hence the term "switching losses".

Returning to FIG. 2, the first illustrative embodiment minimizes these switching losses by providing a quick shut-off circuit, coupled to the gate and source of the FET Q3, that includes transistor Q4, capacitor C10, and resistors R8 and R12. The quick shut-off circuit is a common-base amplifier circuit where the emitter of Q4 is coupled to the source of Q3 through the capacitor C10 and the collector of Q4 is coupled to the gate of Q3. When the power switching transistor Q3 is switched off, the voltages of both the gate and the source of Q3 head towards ground. The negative going edge on the source of Q3 is coupled into the capacitor C10, which produces a negative voltage at the emitter of Q4. This negative spike causes the transistor Q4 to saturate, and the negative voltage appears on the collector of Q4, which is coupled to the gate of Q3. The negative voltage forces the gate of power switching transistor Q3 below ground, minimizing the positive difference in potential between the gate and the source of power switching transistor Q3. The switching losses are correspondingly reduced, yielding a more efficient DC-DC converter than previously available. Greater efficiency results in less heat dissipation, reducing the footprint of the DC-DC converter by reducing the need for heat sinks.

As stated previously, the output voltage VCC is determined by the duty cycle of the switching regulator IC U1 The duty cycle of the switching regulator IC U1 is determined by comparing a sensed voltage level to the internal setpoint reference voltage of U1. If the sensed voltage is greater than the internal setpoint reference voltage, the duty cycle of U1 is decreased. Similarly, if the sensed voltage is less than the internal setpoint reference voltage, the duty cycle of U1 is increased. When the internal setpoint reference voltage of U1 is sufficiently accurate, the output voltage at node 400 can be coupled directly to switching regulator IC U1.

However, where the internal setpoint reference voltage assurance of the switching regulator U1 cannot provide the desired level of precision, coupling the voltage of the output node directly to the switching regulator IC U1 is inadequate. A typical prior art solution is to replace switching regulator U1 with a different switching regulator IC having the desired accuracy level. However, implementing high precision switching regulator ICs can be cost-prohibitive. The first illustrative embodiment overcomes this limitation by inserting an output voltage control circuit into the feedback loop between the output node of the DC-DC converter and the switching regulator U1. The output voltage control circuit includes resistors R9 and R16–R21, capacitors C12 and C16, transistor Q7, and a voltage reference IC U3 that has a very high precision internal setpoint reference voltage. Transistor Q7 is preferably a PNP transistor and is used to form an inverter circuit with resistors R16 and R17. The voltage reference IC U3 and the switching regulator IC U1 are preferably those described in reference to FIG. 1. One having ordinary skill in the art will recognize that the specific pin designations will vary depending on the ICs that are implemented.

The output voltage level on the node 400 is divided by the voltage divider R21 and R20. The resistors R20 and R21 are preferably high accuracy resistors, e.g. 0.1 percent. The voltage at node 325 is sensed and compared to the internal setpoint reference voltage of voltage reference IC U3. In the first illustrative embodiment, the voltage at node 325 is preferably set to equal the internal setpoint reference voltage of voltage reference IC U3 when the output voltage of the DC-DC converter is equal to VCC, or 5.275 volts. The output voltage VCC of the DC-DC converter can be set to different voltage levels by changing the value of either resistor R20 or resistor R21 to adjust the voltage divider relationship, as is well known in the prior art.

The voltage reference IC U3 continuously generates an output reference voltage level on its pin 1. If the voltage sensed at node 325 is less than the internal setpoint reference voltage of the voltage regulator IC U3, the voltage regulator IC U3 drives the output reference voltage level higher. This voltage is inverted by the inverter circuit such that the switching regulator IC U1 sees the output reference voltage as decreasing. The switching regulator IC U1 responds by increasing its duty cycle. If the voltage sensed at node 325 is greater than the internal setpoint reference voltage of the voltage regulator IC U3, the voltage regulator IC U3 drives the output reference voltage lower. This voltage is inverted by the inverter circuit, which causes the switching regulator IC U1 to see an increase in the sensed output reference voltage. The switching regulator IC U1 responds by decreasing its duty cycle. The total accuracy of the DC-DC converter is approximately plus or minus 1.5 percent, which is a result of the 1.2 percent accuracy of the internal setpoint reference voltage of U3 and high accuracy resistors R20 and R21. Of course, the total precision will vary depending on the components that are chosen.

When the output voltage level of the DC-DC converter is a non-standard voltage such as 5.275 volts, care must be taken to ensure that standard TTL and CMOS devices that interface with the non-standard IC are not damaged due to an excessive voltage swing. Therefore, the present embodiment utilizes a system operating voltage SVCC tracking circuit, coupled between the node 400 and the voltage regulator IC U3, that ensures that VCC will never exceed the system operating voltage SVCC by more than a predetermined amount. Tracking is necessary because the system SVCC typically can be inaccurate by as much as plus or minus five percent. This means that a nominal VCC level of 5.0 volts can actually be as little as 4.75 volts. If the nominal output voltage of the DC-DC converter is 5.275 volts at 1.5 percent accuracy, the actual VCC can be as much as 5.35 volts, or 0.6 volts greater than SVCC. This difference in voltage can result in damage to the standard TTL and CMOS devices.

The tracking circuit includes op-amp U2, diode D4, capacitor C17, and resistors R23–R27. The system SVCC is coupled to the negative terminal of U2 via resistor R25. The output voltage VCC of the DC-DC converter is divided by the voltage divider of R26 and R27, and the divided voltage is coupled to the positive terminal of U2. Resistors R26 and R27 are preferably high accuracy resistors, e.g. 0.1 percent. The divided voltage sets an offset between VCC and SVCC of a predetermined amount. If the offset is exceeded, the output of U2 goes high and provides a positive voltage to pin 8 of U3. This voltage forces the DC-DC converter to lower its output voltage so that VCC no longer exceeds SVCC by greater than the predetermined amount. In the first illustrative embodiment, the predetermined amount is set to 0.4 volts.

The remaining circuitry in FIG. 2 includes a power up delay circuit, a power up/power down tracking circuit, and an overvoltage protection circuit. The power up delay circuit includes diodes D7 and D8, resistor R30, and capacitor C2. At start-up, the system voltage SVCC is coupled to pin 5 of the switching regulator IC U1 via diode D8. This voltage causes the switching regulator IC U1 to sense a high voltage and to reduce its duty cycle to zero percent such that power switching FET Q3 remains off. As the capacitor C2 charges up, the voltage at pin 1 of the switching regulator IC U1 is removed, and normal operation begins. The power/up power down tracking circuit insures that VCC and SVCC are within a diode drop of one another during power up and power down. This circuit includes diodes D5 and D6 which are coupled to VCC and SVCC. In case of failure in components U3, Q1, and 1, the overvoltage protection circuit protects the DC-DC converter from output voltages beyond a safe level and includes zener diode ZD1, resistor R4, and transistor Q5.

Figure 5:
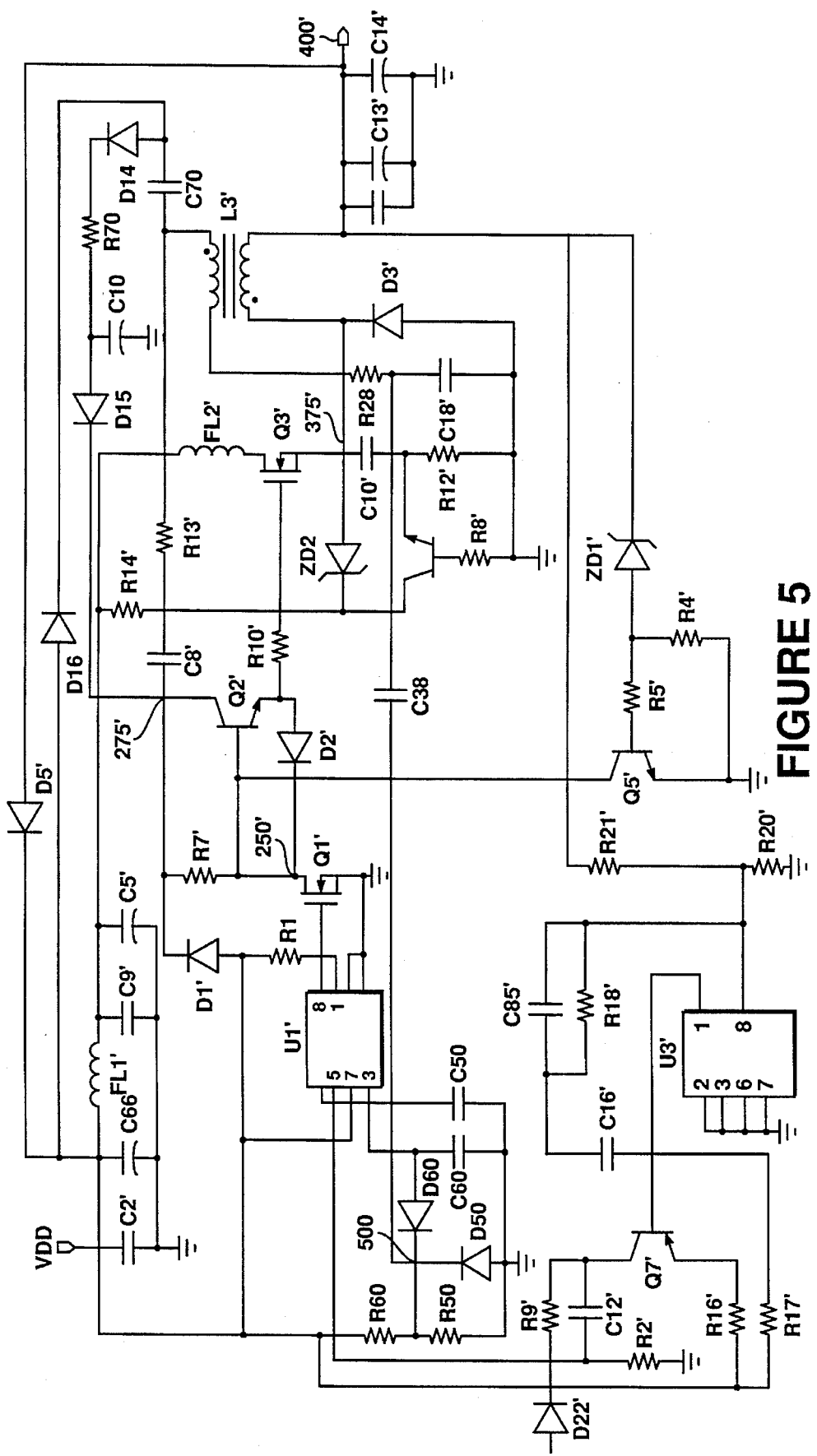
FIG. 5 illustrates a DC-DC converter circuit according to a second illustrative embodiment of the present invention.

A second illustrative embodiment of the present invention is illustrated in FIG. 5. The DC-DC converter of the second illustrative embodiment is substantially that of the first embodiment except that the input voltage VDD is preferably equal to 5.0 volts and the output voltage VCC is preferably equal to 3.3 volts. Those components that are common to both embodiments are labeled with a "primed" designation. For example, switching regulator U1 of the first embodiment is labeled U1' in the second embodiment. Any differences between the first and second embodiments will be discussed in detail below.

The second embodiment does not include a tracking circuit because the DC-DC converter is converting from the TTL operating voltage to the CMOS operating voltage. No tracking circuit is required because the components of the system are typically designed to allow the interface between TTL and CMOS devices. Another difference between the first embodiment and the second embodiment is that the inductor L3' is a transformer, the secondary winding of which is used to change the characteristics of the bootstrap circuit.

To operate properly, the DC-DC converter of the second illustrative embodiment requires a tripling of the input voltage VDD. The bootstrap circuit of the first illustrative embodiment only doubles the input voltage VDD, and is therefore inadequate in this embodiment. The increase in the multiplier of the bootstrap is required because the input voltage VDD has been reduced such that merely doubling VDD cannot bias the gate of the power switching FET Q3' enough to cause the FET Q3' to operate in the saturation region. Thus, the efficiency of the DC-DC converter would be reduced.

This tripling is accomplished by using a 1:1 transformer having primary and secondary windings as the inductor L3'. The secondary winding of the inductor L3' is incorporated as part of the bootstrap circuit. One side of each winding is coupled to the source of Q3', which has a voltage equal to VDD when Q3' is switched on. When VDD is equal to 5.0 volts, if the primary winding of the transformer rises to 5.0 volts, the secondary winding rises to 10 volts. This is because the secondary winding is already at 5.0 volts when 5.0 volts is induced by the primary winding. Thus, the voltages add to produce 10 volts. The capacitor C8' is charged to 10 volts, and the voltage at node 275' is approximately equal to three times VDD. This provides the necessary voltage to drive the power switching transistor Q3'. Incorporating the secondary winding as part of the multiplying bootstrap allows the multiplier of the bootstrap to be varied by simply increasing the number of coils in the secondary winding. The value of the multiplier should be varied according to the operating parameters of the FET Q3' and the magnitude of VDD.

One problem associated with using a transformer as the inductor L3' is that a minimum load must be on the output node 400' at all times in order to insure continuous regulation. This problem can be especially troublesome when the IC that operates according to the output voltage VCC of the DC-DC converter is a processor capable of entering a sleep mode where it draws little or no current. If the processor does not present the minimum load to the output node 400' while in the sleep mode, the bootstrap circuit will not function as required. This means that the power switching FET Q3' will not be fully switched on, and the voltage pulses on the source of FET Q3' will be significantly less than VDD except at times when the capacitor C8' is sufficiently charged. This results in an output voltage VCC that is significantly less than the desired voltage. This is not acceptable because the processor requires continued regulation of VCC to operate in the sleep mode.

One solution is to provide a resistor network (not shown) in parallel with the capacitors C13' and C14'. The resistor provides the requisite minimum load. However, this solution is not preferred because it results in inefficiency during the sleep mode. Therefore, the second embodiment of the present invention utilizes a simulated load circuit to provide the necessary load.

Figure 6:
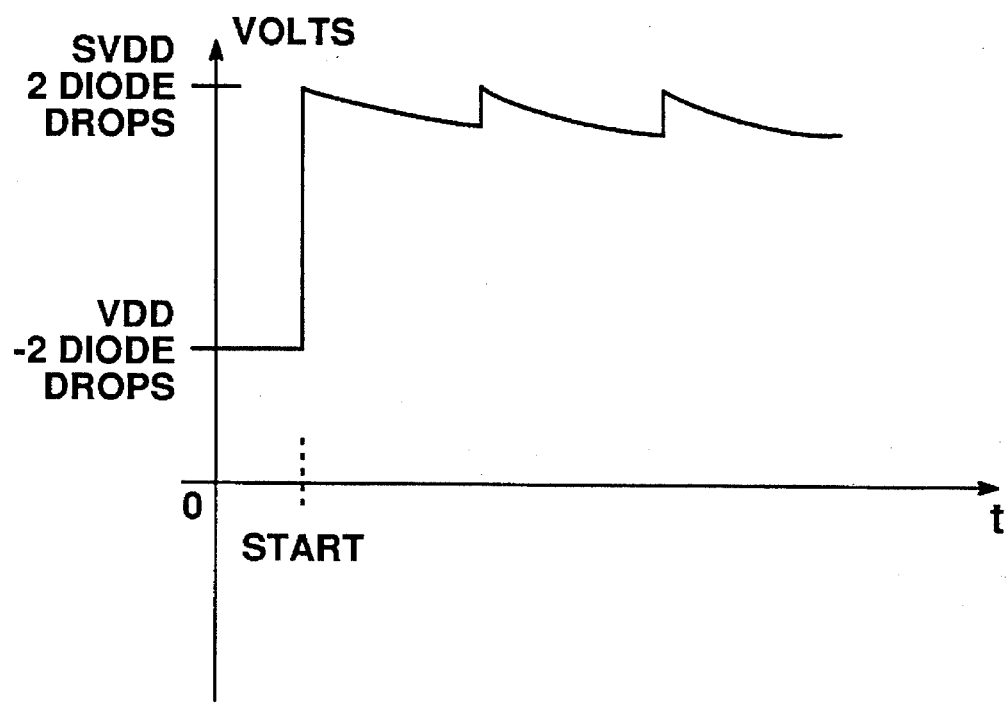
FIG. 6 illustrates the behavior of the simulated minimum load circuit of the second illustrative embodiment.

The simulated load circuit includes capacitors C10 and C70, diodes D14–16, and resistor R70. If the DC-DC converter is attempting to regulate when there is no load on the output node 400', Q3' will be randomly turned on and off, generating pulses across the secondary winding of transformer L3'. The simulated load circuit stores the peak energy generated by the pulses. A baseline voltage of VDD minus two diode drops is set for capacitor C10 via diodes D16 and D14. When the FET Q3' pulses on, a pulse equal to approximately twice VDD minus one diode drop will charge capacitor C10 further via diode D14. Thus, the charge on capacitor C10 is equal to three times VDD minus two diode drops. The behavior of this circuit is illustrated in FIG. 6. Returning to FIG. 5, the capacitor C10 drives a voltage through diode D15 to node 275', and the voltage at node 275' is sufficient to drive the gate of FET Q3' such that the FET Q3' operates in the saturation region when there is no minimum load at the output node 400'. The capacitor C10 is charged by capacitor C70 via dioded D14 and resistor R70 during the positive pulse through the transformer L3'. During the negative pulse through the transformer L3', the capacitor C70 is discharged via diode D16.

One danger of using this circuit is the multiplying bootstrap circuit will also cause capacitor C8' to charge to twice VDD, causing the potential at node 275' to rise to a total of five times VDD minus three diode drops. Such a high voltage can damage the FET Q3'. In order to prevent breakdown of the power switching FET Q3', the zener diode ZD2 is used to limit the maximum biasing voltage on the gate to three times VDD. The value of the zener diode ZD2 should be varied according to the operating parameters of FET Q3' and the magnitude of the voltage at node 275'.

A further difference of the second illustrative embodiment is the duty cycle extender circuit, coupled to the switching regulator IC U1', which includes capacitor C38, diodes D50 and D60, and resistors R50 and R60. Capacitor C50 is a bypass capacitor and capacitor C60 is the capacitor that sets the duty cycle of the switching regulator U1'. Again, this circuit is useful when a processor that is capable of toggling between sleep and active modes is being driven by the DC-DC converter. When the processor goes from the sleep mode to the active mode, the load presented by the processor is increased dramatically. In order to provide maximum current during this transient, it is desirable to have a 100% duty cycle so that the power switching FET Q3' is always on. Unfortunately, typical switching regulators can provide a maximum duty cycle of 90%. The duty cycle extender circuit is used to extend the duty cycle of the switching regulator U1'.

The duty cycle of the switching regulator U1' is normally set internally. In this circuit, the time required to charge and discharge capacitor C60 sets the duty cycle. The period in which the capacitor C60 is charging corresponds to the "on" portion of the duty cycle, while the period of discharge corresponds to the "off" portion of the duty cycle. Capacitor C60 is charged by switching regulator U1', and charging is done at a normal pace. However, diodes D50 and D60 are used to discharge capacitor C60 quickly. In order to discharge the capacitor C60 quickly, the voltage at node 500 is preferably set to 1.5 volts by using the voltage divider formed by resistors R60 and R50. Node 500 is also coupled to the source of power switching transistor Q3' via capacitor C38. Diode D50 charges capacitor C38 during the positive voltage swing of power switching transistor Q3'. When the negative pulse from the source of power switching transistor Q3' is fed to node 500, diode D60 discharges the capacitor C60 discharges to ground. In this embodiment, the capacitor C60 can be discharged quickly, extending the duty cycle of switching regulator U1'.

Thus, a high accuracy DC-DC converter with improved efficiency has been described. Although the present invention has been described in terms of the preferred embodiments, it will be appreciated that various modifications and alterations might be made by those skilled in the art without departing from the spirit and scope of the inventions described in the claims that follow.

What is claimed is:

1. A high precision DC-DC converter circuit for converting a direct current (DC) input voltage VDD to a DC output voltage VCC having a first accuracy level, the circuit comprising:

a switching transistor coupled to VDD, the switching transistor including an input and a first output;

a switching regulator circuit coupled to the input of the switching transistor for driving the switching transistor on and off according to a sensed voltage level such that VDD is coupled to the first output when the switching transistor is on, wherein the switching regulator circuit compares the sensed voltage level to a first setpoint reference voltage level having a second accuracy level to determine a duty cycle for driving the switching transistor;

an output circuit coupled to the first output, the output circuit including a second output, the output circuit for generating a first voltage level at the second output in response to VDD being coupled and uncoupled from the first output; and an output voltage regulator circuit coupled to the second output and the switching regulator circuit, the output voltage regulator circuit for causing the switching regulator circuit to vary the duty cycle by controlling the sensed voltage such that the first voltage level is equal to VCC at the first accuracy level, the output voltage regulator for generating the sensed voltage level in response to comparing the first voltage level to a second internal setpoint reference voltage level having a third accuracy level that is more precise than the first and second accuracy levels.

2. The DC-DC converter circuit of claim 1, wherein the switching regulator circuit further includes a quick shut-off circuit coupled to the input of the switching transistor, the quick shut-off circuit for driving a third voltage level on the input such that switching losses are minimized.

3. The DC-DC converter circuit of claim 1, wherein the DC-DC converter further includes a voltage tracking circuit coupled to the second output, the output voltage regulator circuit, and a system voltage level SVCC, the voltage tracking circuit for reducing the first voltage level if the first voltage level exceeds SVCC by a predetermined amount.

4. A high precision DC-DC converter circuit for converting a direct current (DC) input voltage VDD to a DC output voltage VCC having a first accuracy level, the circuit comprising:

a switching transistor coupled to VDD, the switching transistor including an input and a first output;

a switching regulator circuit coupled to the input of the switching transistor for driving the switching transistor on and off according to a sensed voltage level such that VDD is coupled to the first output when the switching transistor is on, wherein the switching regulator circuit compares the sensed voltage level to a first setpoint reference voltage level having a second accuracy level to determine a duty cycle for driving the switching transistor, the switching regulator circuit further including:

a switching regulator coupled to the sensed voltage level and including a third output, the switching regulator for generating a plurality of pulses having a second voltage level on the third output; and a bootstrap circuit coupled to the third output and to the input, the bootstrap circuit for pulling up the second voltage level such that the switching transistor operates in a saturation range when switched on;

an output circuit coupled to the first output, the output circuit including a second output, the output circuit for generating a first voltage level at the second output in response to VDD being coupled and uncoupled from the first output, the output circuit further including a transformer having a primary winding and a secondary winding, the primary and secondary windings being coupled to the first output, the secondary winding being coupled to the bootstrap circuit; and an output voltage regulator circuit coupled to the second output and the switching regulator circuit, the output voltage regulator circuit for causing the switching regulator circuit to vary the duty cycle by controlling the sensed voltage such that the first voltage level is equal to VCC at the first accuracy level, the output voltage regulator for generating the sensed voltage level in response to comparing the first voltage level to a second internal setpoint reference voltage level having a third accuracy level that is more precise than the first and second accuracy levels.

5. The DC-DC converter circuit of claim 4, wherein the DC-DC converter circuit further includes a simulated minimum load circuit comprising a plurality of resistors coupled to the second output, the simulated minimum load circuit for sinking a predetermined minimum of current such that the transformer continues operation and the DC-DC converter maintains a regulated output.

6. The DC-DC converter circuit of claim 4, wherein the DC-DC converter circuit further includes a simulated minimum load circuit coupled to the bootstrap circuit, the simulated minimum load circuit providing voltage to the bootstrap circuit such that the bootstrap circuit drives switching transistor normally when no minimum load is present on the second output.

7. The DC-DC converter circuit of claim 4, wherein the DC-DC converter further includes a duty cycle extender circuit coupled to the switching regulator circuit, the duty cycle extender circuit for extending the duty cycle of the switching regulator circuit beyond a predefined maximum duty cycle.

8. The DC-DC converter circuit of claim 4, wherein the switching regulator circuit further includes a quick shut-off circuit coupled to the input of the switching transistor, the quick shut-off circuit for driving a third voltage level on the input such that switching losses are minimized.

9. A computer system comprising:

a power supply for outputting a nominal direct current (DC) voltage VDD at a first accuracy level;

a plurality of components coupled to the power supply, each of the components using a system operating voltage SVCC as its operating voltage;

a processor coupled to at least one of the plurality of components, the processor requiring a DC voltage of VCC at a second accuracy level as its operating voltage; and a high precision DC-DC converter circuit coupled to the power supply and the processor, the DC-DC converter circuit for converting the DC voltage VDD to the DC voltage VCC at the second accuracy level, the DC-DC converter circuit further including:

a switching transistor coupled to VDD, the switching transistor including an input and a first output;

a switching regulator circuit coupled to the input of the switching transistor for driving the switching transistor on and off according to a sensed voltage level such that VDD is coupled to the first output when the switching transistor is on, wherein the switching regulator circuit compares the sensed voltage level to a first setpoint reference voltage level having a second accuracy level to determine a duty cycle for driving the switching transistor;

an output circuit coupled to the first output, the output circuit including a second output, the output circuit for generating a first voltage level at the second output in response to VDD being coupled and uncoupled from the first output; and an output voltage regulator circuit coupled to the second output and the switching regulator circuit, the output voltage regulator circuit for causing the switching regulator circuit to vary the duty cycle by controlling the sensed voltage such that the first voltage level is equal to VCC at the first accuracy level, the output voltage regulator for generating the sensed voltage level in response to comparing the first voltage level to a second internal setpoint reference voltage level having a third accuracy level that is more precise than the first and second accuracy levels.

10. The computer system of claim 9, wherein the switching regulator circuit further includes a quick shut-off circuit coupled to the input of the switching transistor, the quick shut-off circuit for driving a third voltage level on the input such that switching losses are minimized.

11. The computer system of claim 9, wherein the DC-DC converter further includes a voltage tracking circuit coupled to the second output, the output voltage regulator circuit, and a system voltage level SVCC, the voltage tracking circuit for reducing the first voltage level if the first voltage level exceeds SVCC by a predetermined amount.

12. The computer system of claim 11, wherein the processor is a Pentium™ microprocessor manufactured by Intel Corporation of Santa Clara, Calif.

13. A computer system comprising:

a power supply for outputting a nominal direct current (DC) voltage VDD at a first accuracy level;

a plurality of components coupled to the power supply, each of the components using a system operating voltage SVCC as its operating voltage;

a processor coupled to at least one of the plurality of components, the processor requiring a DC voltage of VCC at a second accuracy level as its operating voltage; and a high precision DC-DC converter circuit coupled to the power supply and the processor, the DC-DC converter circuit for converting the DC voltage VDD to the DC voltage VCC at the second accuracy level, the DC-DC converter circuit further including:

a switching transistor coupled to VDD, the switching transistor including an input and a first output;

a switching regulator circuit coupled to the input of the switching transistor for driving the switching transistor on and off according to a sensed voltage level such that VDD is coupled to the first output when the switching transistor is on, wherein the switching regulator circuit compares the sensed voltage level to a first setpoint reference voltage level having a second accuracy level to determine a duty cycle for driving the switching transistor, the switching regulator circuit further including:

a switching regulator coupled to the sensed voltage level and including a third output, the switching regulator for generating a plurality of having a second voltage level on the third output; and a bootstrap circuit coupled to the third output and to the input, the bootstrap circuit for pulling up the second voltage level such that the switching transistor operates in a saturation range when switched on;

an output circuit coupled to the first output, the output circuit including a second output, the output circuit for generating a first voltage level at the second output in response to VDD being coupled and uncoupled from the first output, the output circuit further including a transformer having a primary winding and a secondary winding, the primary and secondary windings being coupled to the first output, the secondary winding being coupled to the bootstrap circuit; and an output voltage regulator circuit coupled to the second output and the switching regulator circuit, the output voltage regulator circuit fox causing the switching regulator circuit to vary the duty cycle by controlling the sensed voltage such that the first voltage level is equal to VCC at the first accuracy level, the output voltage regulator for generating the sensed voltage level in response to comparing the first voltage level to a second internal setpoint reference voltage level having a third accuracy level that is more precise than the first and second accuracy levels.

14. The DC-DC converter circuit of claim 13, wherein the DC-DC converter circuit further includes a simulated minimum load circuit comprising a plurality of resistors coupled to the second output, the simulated minimum load circuit for sinking a predetermined minimum of current such that the transformer continues operation and the DC-DC converter maintains a regulated output.

15. The DC-DC converter circuit of claim 13, wherein the DC-DC converter circuit further includes a simulated minimum load circuit coupled to the bootstrap circuit, the simulated minimum load circuit providing voltage to the bootstrap circuit such that the bootstrap circuit drives the gate of the switching transistor normally when no minimum load is present on the second output.

16. The DC-DC converter circuit of claim 13, wherein the DC-DC converter further includes a duty cycle extender circuit coupled to the switching regulator circuit, the duty cycle extender circuit for extending the duty cycle of the switching regulator circuit beyond a predetermined maximum duty cycle.

17. The DC-DC converter circuit of claim 13, wherein the switching regulator circuit further includes a quick shut-off circuit coupled to the input of the switching transistor, the quick shut-off circuit for driving a third voltage level on the input such that switching losses are minimized.

18. A method for converting a direct current (DC) input voltage VDD into a DC output voltage VCC having a first accuracy level, the method comprising the steps of:

providing a switching transistor;

switching the switching transistor on and off to produce an output voltage level equal to VDD multiplied by a duty cycle, the duty cycle being a percentage of time that the switching transistor is turned on;

varying the duty cycle of the switching transistor in response to a comparison of a sensed voltage level to a first setpoint reference voltage having a second accuracy level;

sensing the output voltage level; and generating the sensed voltage level in response to a comparison of the output voltage level to a second setpoint reference voltage having a third accuracy level that is more precise than the first and second accuracy levels such that the output voltage level is VCC within the first accuracy level.

19. The method according to claim 18, wherein the method further includes the step of:

driving a negative voltage on an input of the switching transistor such that the switching transistor switches off quickly, reducing switching losses.

20. The method according to claim 18, wherein the method further includes the step of:

reducing the output voltage level if the output voltage level exceeds a system operating voltage level SVCC by a predetermined amount.

21. A method for converting a direct current (DC) input voltage VDD into a DC output voltage VCC having a first accuracy level, the method comprising the steps of:

providing a switching transistor;

switching the switching transistor on and off to produce an output voltage level equal to VDD multiplied by a duty cycle, the duty cycle being a percentage of time that the switching transistor is turned on;

varying the duty cycle of the switching transistor in response to a comparison of a sensed voltage level to a first setpoint reference voltage having a second accuracy level;

sensing the output voltage level;

generating the sensed voltage level in response to a comparison of the output voltage level to a second setpoint reference voltage having a third accuracy level that is more precise than the first and second accuracy levels such that the output voltage level is VCC within the first accuracy level; and extending the duty cycle of the switching transistor beyond a predetermined maximum duty cycle if a load increases such that extension of the duty cycle is necessary to provide sufficient power.

22. The method according to claim 21, wherein the method further includes the step of:

driving a negative voltage on an input of the switching transistor such that the switching transistor switches off quickly, reducing switching losses.

23. The method according to claim 21, wherein the method further includes the step of:

simulating the load when the load is less than a predetermined minimum.

24. A high precision DC-DC converter circuit for converting a direct current (DC) input voltage VDD to a DC output voltage VCC having a first accuracy level, the circuit comprising:

a switching transistor;

means for switching the switching transistor on and off to produce an output voltage level equal to VDD multiplied by a duty cycle, the duty cycle being a percentage of time that the switching transistor is turned on;

means for varying the duty cycle of the switching transistor in response to a comparison of a sensed voltage level to a first setpoint reference voltage having a second accuracy level;

means for sensing the output voltage level; and means for generating the sensed voltage level in response to a comparison of the output voltage level to a second setpoint reference voltage having a third accuracy level that is more precise than the first and second accuracy levels such that the output voltage level is VCC within the first accuracy level.

25. The DC-DC converter circuit of claim 24, further including:

means for driving a negative voltage on an input of the switching transistor such that the switching transistor switches off quickly, reducing switching losses.

26. The DC-DC converter circuit of claim 24, further including:

means for reducing the output voltage level if the output voltage level exceeds a system operating voltage level SVCC by a predetermined amount.

27. A high precision DC-DC converter circuit for converting a direct current (DC) input voltage VDD to a DC output voltage VCC having a first accuracy level, the circuit comprising::

a switching transistor;

means for switching the switching transistor on and off to produce an output voltage level equal to VDD multiplied by a duty cycle, the duty cycle being a percentage of time that the switching transistor is turned on;

means for varying the duty cycle of the switching transistor in response to a comparison of a sensed voltage level to a first setpoint reference voltage having a second accuracy level;

means for sensing the output voltage level;

means for generating the sensed voltage level in response to a comparison of the output voltage level to a second setpoint reference voltage having a third accuracy level that is more precise than the first and second accuracy levels such that the output voltage level is VCC within the first accuracy level; and means for extending the duty cycle of the switching transistor beyond a predetermined maximum duty cycle if a load increases such that extension of the duty cycle is necessary to provide sufficient power.

28. The DC-DC converter circuit of claim 27, further including:

means for driving a negative voltage on an input of the switching transistor such that the switching transistor switches off quickly, reducing switching losses.

29. The DC-DC converter circuit of claim 27, further including:

means for simulating the load when the load is less than a predetermined minimum.

30. A computer system comprising:

a power supply for outputting a nominal direct current (DC) voltage VDD at a first accuracy level;

an integrated circuit coupled to at least one of the plurality of components, the integrated circuit requiring a DC voltage of VCC at a second accuracy level as its operating voltage; and a high precision DC-DC converter circuit coupled to the power supply and the integrated circuit, the DC-DC converter circuit for converting the DC voltage VDD to the DC voltage VCC at the second accuracy level, the DC-DC converter circuit further including:

a switching transistor;

means for switching the switching transistor on and off to produce an output voltage level equal to VDD multiplied by a duty cycle, the duty cycle being a percentage of time that the switching transistor is turned on;

means for varying the duty cycle of the switching transistor in response to a comparison of a sensed voltage level to a first setpoint reference voltage having a second accuracy level;

means for sensing the output voltage level; and means for generating the sensed voltage level in response to a comparison of the output voltage level to a second setpoint reference voltage having a third accuracy level that is more precise than the first and second accuracy levels such that the output voltage level is VCC within the first accuracy level.

31. The computer system of claim 30, further including:

means for driving a negative voltage on an input of the switching transistor such that the switching transistor switches off quickly, reducing switching losses.

32. The computer system of claim 30, further including:

means for reducing the output voltage level if the output voltage level exceeds a system operating voltage level SVCC by a predetermined amount.

33. A computer system comprising:

a power supply for outputting a nominal direct current (DC) voltage VDD at a first accuracy level;

an integrated circuit coupled to at least one of the plurality of components, the integrated circuit requiring a DC voltage of VCC at a second accuracy level as its operating voltage; and a high precision DC-DC converter circuit coupled to the power supply and the integrated circuit, the DC-DC converter circuit for converting the DC voltage VDD to the DC voltage VCC at the second accuracy level, the DC-DC converter circuit further including:

a switching transistor;

means for switching the switching transistor on and off to produce an output voltage level equal to VDD multiplied by a duty cycle, the duty cycle being a percentage of time that the switching transistor is turned on;

means for varying the duty cycle of the switching transistor in response to a comparison of a sensed voltage level to a first setpoint reference voltage having a second accuracy level;

means for sensing the output voltage level;

means for generating the sensed voltage level in response to a comparison of the output voltage level to a second setpoint reference voltage having a third accuracy level that is more precise than the first and second accuracy levels such that the output voltage level is VCC within the first accuracy level; and means for extending the duty cycle of the switching transistor beyond a predetermined maximum duty cycle if a load increases such that extension of the duty cycle is necessary to provide sufficient power.

34. The computer system of claim 33, further including:

means for driving a negative voltage on an input of the switching transistor such that the switching transistor switches off quickly, reducing switching losses.

35. The computer system of claim 33, further including:

means for simulating the load when the load is less than a predetermined minimum.

* * * * *

UNITED STATES PATENT AND TRADEMARK OFFICE
CERTIFICATE OF CORRECTION

PATENT NO. : 5,534,771
DATED : July 9, 1996
INVENTOR(S) : Harold L. Massie

It is certified that error appears in the above-indentified patent and that said Letters Patent is hereby corrected as shown below:

In column 4 at line 63 delete "TEL" and insert --TTL--

In column 13 at line 64 insert --pulses-- following "of" and prior to --having--

In column 14 at line 14 delete "fox" and insert --for--

Signed and Sealed this

Fifth Day of November, 1996

Attest:

BRUCE LEHMAN

Attesting Officer

Commissioner of Patents and Trademarks